(12) United States Patent  
Chen et al.

(10) Patent No.: US 9,184,250 B1  
(45) Date of Patent: Nov. 10, 2015

(54) SEMICONDUCTOR ARRANGEMENT AND FORMATION THEREOF

(71) Applicant: Taiwan Semiconductor Manufacturing Company Limited, Hsin-Chu (TW)

(72) Inventors: Chih-Liang Chen, Hsinchu (TW); Helen Shu-Hui Chang, Baoshan Township (TW); Charles Chew-Yuen Young, Cupertino, CA (US); Jiann-Tyng Tzeng, Hsin Chu (TW); Kam-Tou Sio, Zhubei (TW); Wei-Cheng Lin, Taichung (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/289,694

(22) Filed: May 29, 2014

(51) Int. Cl.
  *H01L 29/417* (2006.01)
  *H01L 27/088* (2006.01)
  *H01L 21/8234* (2006.01)
  *H01L 29/423* (2006.01)

(52) U.S. Cl.
  CPC .. *H01L 29/41775* (2013.01); *H01L 21/823456* (2013.01); *H01L 27/088* (2013.01); *H01L 29/42356* (2013.01)

(58) Field of Classification Search
  CPC .................. H01L 27/088; H01L 21/823456; H01L 29/42356
  See application file for complete search history.

(56) References Cited

U.S. PATENT DOCUMENTS 6,133,101 A * 10/2000 Wu ............................... 438/276
6,143,594 A * 11/2000 Tsao et al. ..................... 438/199
6,177,737 B1 * 1/2001 Palfey et al. ................... 307/64

* cited by examiner

*Primary Examiner* — Richard Booth
(74) *Attorney, Agent, or Firm* — Cooper Legal Group, LLC (57) ABSTRACT

A semiconductor arrangement and methods of formation are provided. The semiconductor arrangement includes a first contact having first contact dimensions that are relative to first gate dimensions of at least one of a first gate or a second gate, where relative refers to a specific relationship between the first contact dimensions and the first gate dimensions. The first contact is between the first gate and the second gate. The first contact having the first contact dimensions relative to the first gate dimensions has lower resistance with little to no increased capacitance, as compared to a semiconductor arrangement having first contact dimensions not in accordance with the specific relationship. The semiconductor arrangement having the lower resistance with little to no increased capacitance exhibits at least one of improved performance or reduced power requirements than a semiconductor arrangement that does not have such lower resistance with little to no increased capacitance.

20 Claims, 8 Drawing Sheets

SEMICONDUCTOR ARRANGEMENT AND FORMATION THEREOF

BACKGROUND

In a semiconductor device, such as a transistor, current flows through a channel region between a source region and a drain region upon application of a sufficient voltage or bias to a gate of the device. When current flows through the channel region, the transistor is generally regarded as being in an 'on' state, and when current is not flowing through the channel region, the transistor is generally regarded as being in an 'off' state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor arrangement and resulting structures formed thereby are provided herein.

Figure 1:
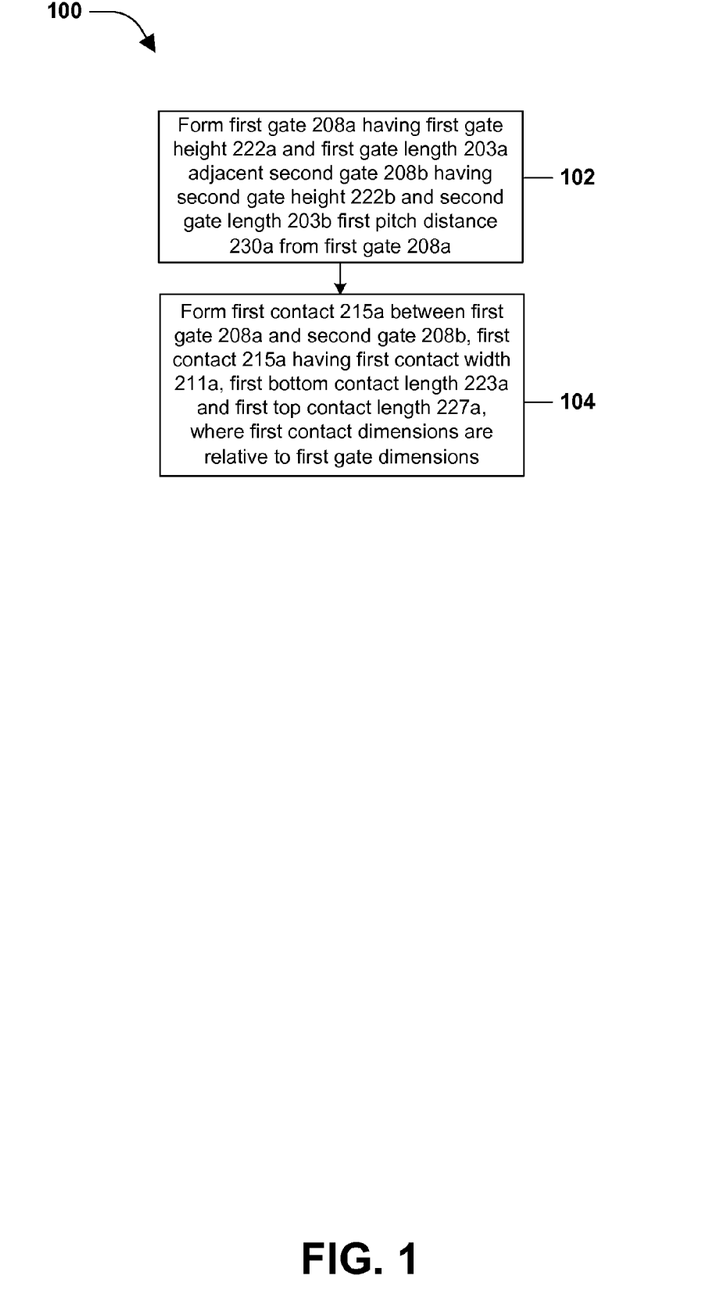
FIG. 1 is a flow diagram illustrating a method of forming a semiconductor arrangement, in accordance with some embodiments.
Figure 2:
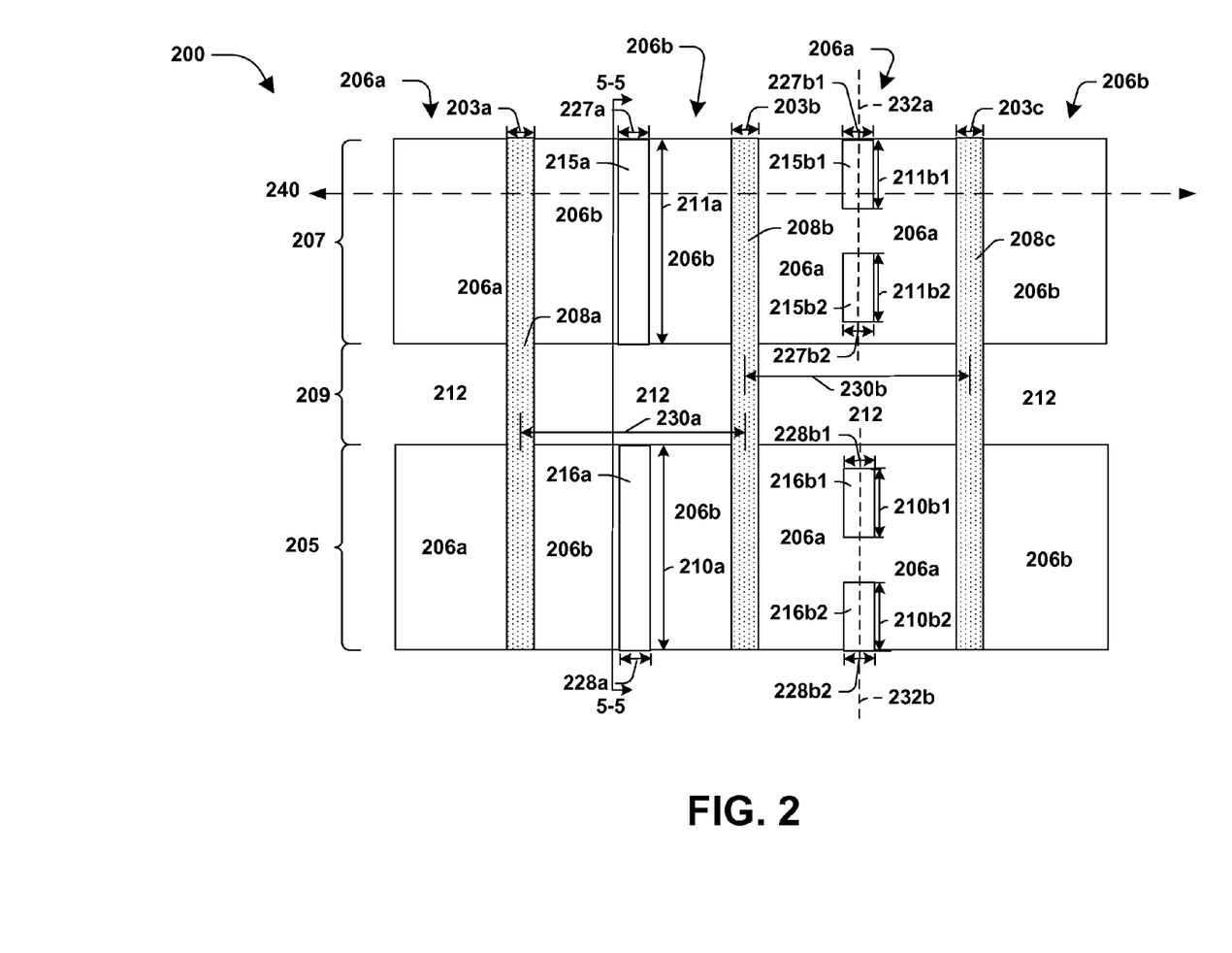
FIG. 2 is an illustration of a semiconductor arrangement, in accordance with some embodiments.
Figure 3:
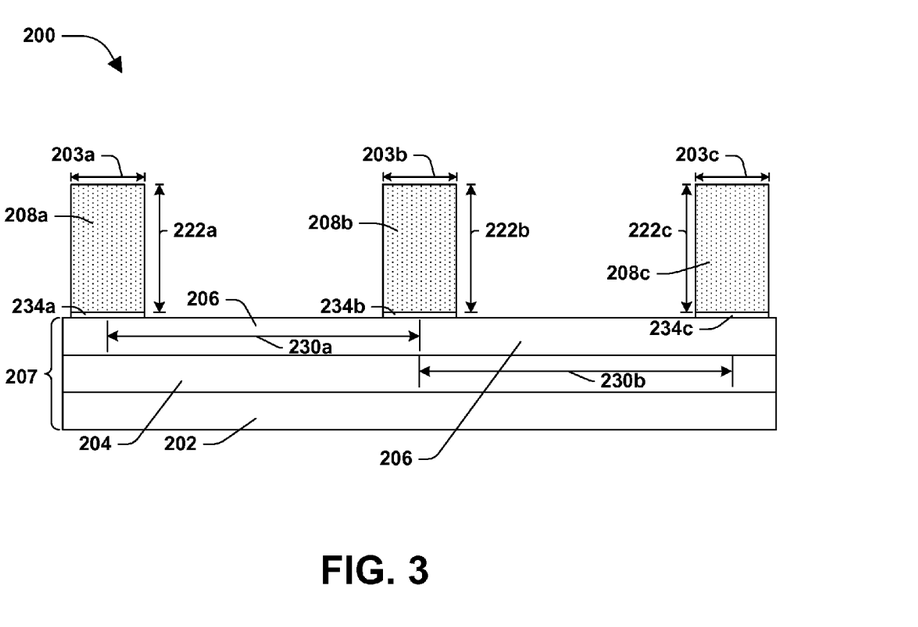
FIG. 3 is an illustration of a semiconductor arrangement, in accordance with some embodiments.
Figure 4:
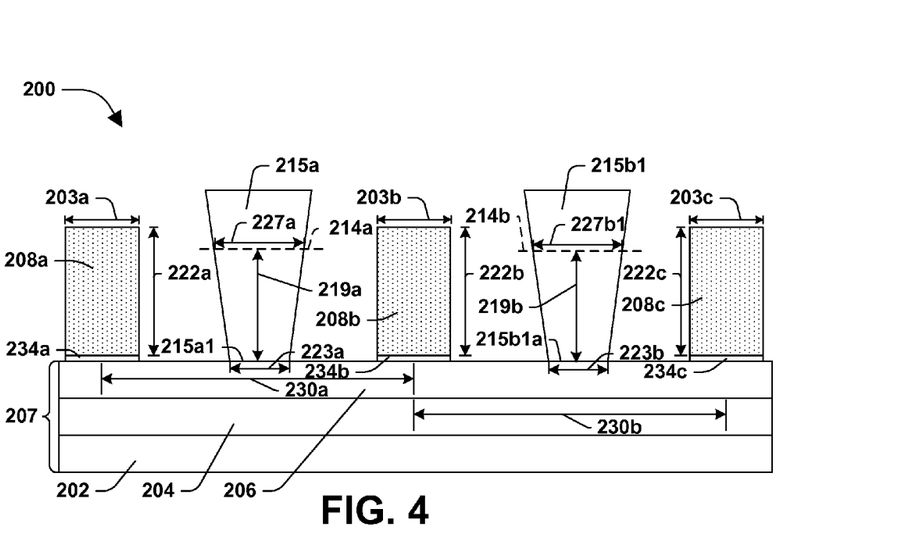
FIG. 4 is an illustration of a semiconductor arrangement, in accordance with some embodiments.
Figure 5:
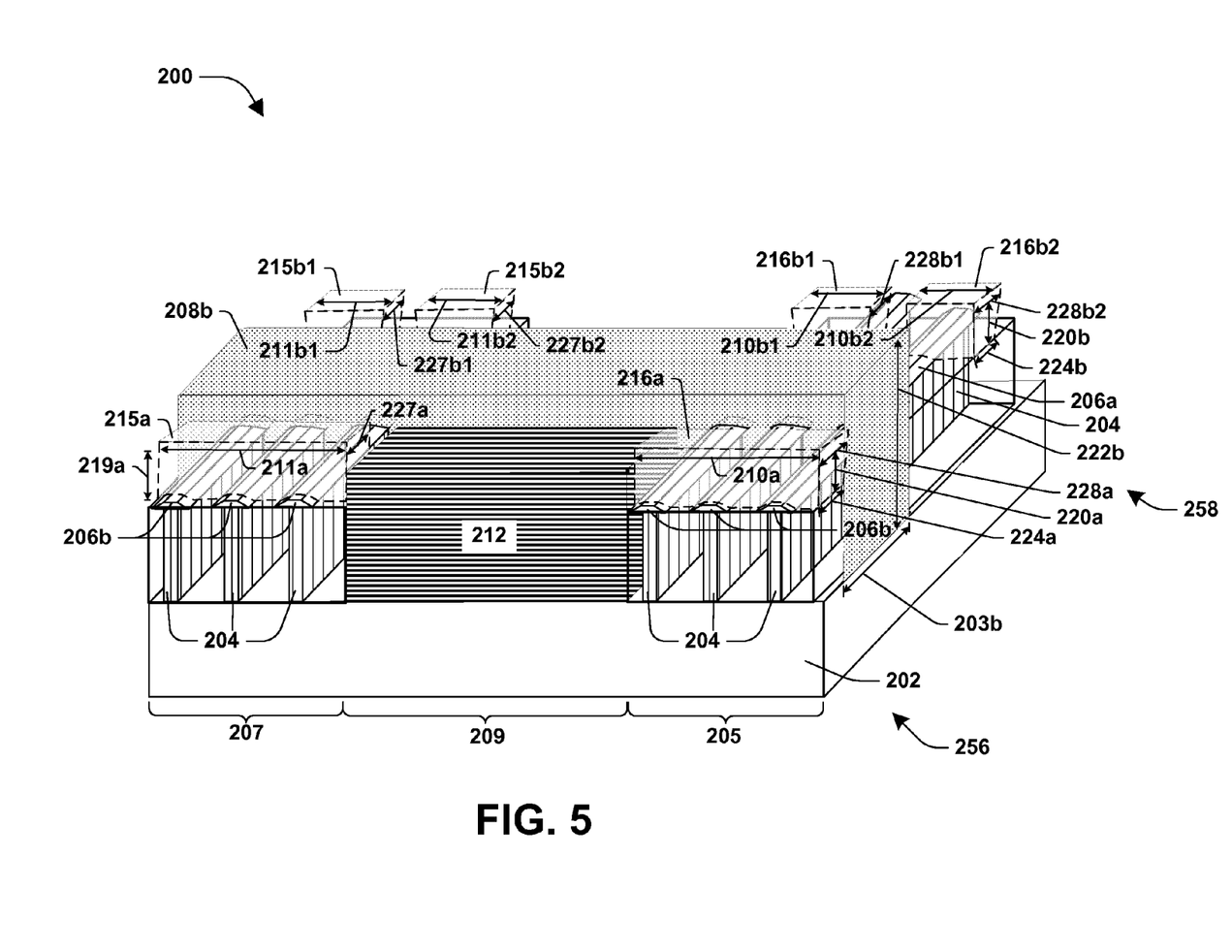
FIG. 5 is an illustration of a semiconductor arrangement, in accordance with some embodiments.

A first method 100 of forming a semiconductor arrangement 200 is illustrated in FIG. 1, and one or more semiconductor arrangements formed by such a method are illustrated in FIGS. 2-5. FIG. 2 is a top view of the semiconductor arrangement 200, and FIGS. 3 and 4 are cross sectional views of the semiconductor arrangement 200 at various stages of fabrication, taken along a first line 240 in FIG. 2. FIG. 5 is a 3D cross-sectional view of the semiconductor arrangement 200 as viewed from a perspective indicated by a second line 5-5 in FIG. 2.

In some embodiments, such as illustrate in FIG. 4, a first gate 208a of the semiconductor arrangement 200 has a first gate height 222a and a first gate length 203a. The first gate 208a is adjacent a first contact 215a having a first bottom contact length 223a and a first top contact length 227a lying within a first top contact length plane 214a. In some embodiments, the first top contact length plane 214a is parallel to a bottom surface 215a1 of the first contact 215a. In some embodiments, the first top contact length plane 214a is a first critical contact distance 219a from the bottom surface 215a1 of the first contact 215a. In some embodiments, dimensions of the semiconductor arrangement 200, such as the first critical contact distance 219a, conform to equation (1) below.

$$D_c = k1 \times L \qquad (1)$$

In equation (1), $D_c$ is a critical contact distance of a contact, k1 is a first constant and L is a gate length of a gate adjacent the contact having the critical contact distance. According to some embodiments, $D_c$ thus corresponds to the first critical contact distance 219a of the first contact 215a and L corresponds to the first gate length 203a of the first gate 208a such that the first critical contact distance 219a of the first contact 215a is k1 times the first gate length 203a of the first gate 208a. In some embodiments, the first constant k1 is approximately 1.6. In some embodiments, the first constant k1 is about 1.58 to about 1.62, such that the critical distance $D_c$ is about 1.58 times the gate length to about 1.62 times the gate length. In some embodiments, such as where the first gate length 203a is about 75 μm, the first critical contact distance 219a is thus between about 39.5 μm to about 40.5 μm ((75 μm times about 1.58=about 39.5 μm) to (75 μm times about 1.62=about 40.5 μm)).

In some embodiments, a second gate 208b has a second gate height 222b and a second gate length 203b. In some embodiments, the first gate 208a is a first pitch distance 230a from the second gate 208b, where the first pitch distance 230a is measured from a location of the first gate 208a to a corresponding location of the second gate 208b, such as from the middle of the first gate 208a to the middle of the second gate 208b. In some embodiments, the second gate 208b is adjacent the first contact 215a, such that the first contact 215a is between the first gate 208a and the second gate 208b. In some embodiments, first contact dimensions of the first contact 215a are relative to first gate dimensions of at least one of the first gate 208a or the second gate 208b. In some embodiments, the first contact dimensions comprise the first bottom contact length 223a, the first top contact length 227a, the first critical contact distance 219a, and a first contact width 211a, illustrated in FIGS. 2 and 5, of the first contact 215a. In some embodiments, dimensions of the semiconductor arrangement 200 conform to equation (2) below.

$$\frac{((k2 \times H) + (k3 \times L) + P - k4)}{((k5 \times H) + P + (k6 \times L))} \leq \sim 0.56 \qquad (2)$$

In equation (2), k2 is a second constant, H is a height of a gate, such as at least one of the first gate height 222a or the second gate height 222b, k3 is a third constant, L is a length of a gate, such as at least one of the first gate length 203a or the second gate length 203b, P is a pitch distance between adjacent gates, such as the first pitch distance 230a between the first gate 208a and the second gate 208b, k4 is a fourth constant, k5 is a fifth constant and k6 is a sixth constant. In some embodiments, the numerator of the second constant times at least one of the first gate height 222a or the second gate height 222b (H) plus the third constant times at least one of the first gate length 203a or the second gate length 203b (L) plus the first pitch distance 230a (P) minus the fourth constant divided by the denominator of the fifth constant times at least one of the first gate height 222a or the second gate height 222b (H) plus the first pitch distance 230a (P) plus the sixth constant times at least one of the first gate length 203a or the second gate length 203b (L) is less than or equal to approximately 0.56, where approximately 0.56 corresponds to about 0.54 to about 0.58.

In some embodiments, at least one of the second constant k2 is approximately 0.28, the third constant k3 is approximately 0.72, the fourth constant is approximately 50, the fifth constant is approximately 0.20 or the sixth constant k6 is approximately 0.80. In some embodiments, at least one of the second constant k2 is about 0.26 to about 0.30, the third constant k3 is about 0.70 to about 0.74, the fourth constant k4 is about 48 to about 52, the fifth constant k5 is about 0.18 to about 0.22 or the sixth constant k6 is about 0.78 to about 0.82. In some embodiments, such as where at least one of the first gate height 222a or the second gate height 222b (H) is about 75 μm, where at least one of the first gate length 203a or the second gate length 203b (L) is about 25 μm, and where the first pitch distance 230a (P) is about 50 μm, the left side of equation (2) yields between about 0.45 to about 0.47, which falls below 0.56 and thus the dimensions of the semiconductor arrangement 200 conform to equation (2).

Turning to FIG. 2, the first contact 215a has the first contact width 211a. In some embodiments, a sum of contact widths comprises a sum of widths of contacts disposed between adjacent gates and in a single active area, such as a first active area 207 or a second active area 205. In some embodiments, the dimensions of the semiconductor arrangement 200, such as the first contact width 211a, conform to equation (3) below.

$$W \geq k7 \times L \qquad (3)$$

In equation (3), W is a sum of contact widths of contacts disposed between adjacent gates and in a single active area, such as the first contact width 211a, k7 is a seventh constant and L is the length of a gate adjacent the contact in question, such as at least one of the first gate length 203a or the second gate length 203b. In some embodiments, the seventh constant is approximately 1.50. In some embodiments, the seventh constant is about 1.48 to about 1.52, such that the first contact width 211a (W) is about 1.48 to about 1.52 times greater than or equal to at least one of the first gate length 203a or the second gate length 203b (L). In some embodiments, such as where at least one of the first gate length 203a or the second gate length 203b is about 25 μm the first contact width 211a is between about 37 μm to about 38 μm.

In some embodiments, such as illustrated in FIG. 4, the dimensions of the semiconductor arrangement 200, such as the first top contact length 227a, conform to equation (4) below.

$$C_{tl} \geq (k8 \times H) + (k9 \times L) \qquad (4)$$

In equation (4), $C_{tl}$ is a top contact length of a contact, such as the first top contact length 227a of the first contact 215a, k8 is an eighth constant, H is the height of a gate adjacent the contact in question, such as at least one of the first gate height 222a or the second gate height 222b, k9 is a ninth constant and L is the length of the gate adjacent the contact in question, such as at least one of the first gate length 203a or the second gate length 203b. In some embodiments, the eighth constant is approximately 0.20 and the ninth constant is approximately 0.76. In some embodiments, the eighth constant is about 0.18 to about 0.22 and the ninth constant is about 0.74 to about 0.78 such that, the first top contact length 227a ($C_{tl}$) is greater than or equal to about 0.18 to about 0.22 times at least one of the first gate height 222a or the second gate height 222b (H) plus about 0.74 to about 0.78 times at least one of the first gate length 203a or the second gate length 203b (L). In some embodiments, such as where at least one of the first gate height 222a or the second gate height 222b (H) is about 75 μm and at least one of the first gate length 203a or the second gate length 203b (L) is about 25 μm, the first top contact length 227a ($C_{tl}$) is greater than or equal to about 32 μm to about 36 μm.

In some embodiments, the dimensions of the semiconductor arrangement 200, such as the first bottom contact length 223a, conform to equation (5) below.

$$C_{bl} \geq (k10 \times H) + (k11 \times L) \qquad (5)$$

In equation (5), $C_{bl}$ is a bottom contact length of a contact, such as the first bottom contact length 223a of the first contact 215a, k10 is a tenth constant, H is the height of a gate adjacent the contact in question, such as at least one of the first gate height 222a or the second gate height 222b, k11 is an eleventh constant and L is the length of the gate adjacent the contact in question, such as at least one of the first gate length 203a or the second gate length 203b. In some embodiments, the tenth constant is approximately 0.66 and the eleventh constant is approximately 0.70. In some embodiments, the tenth constant is about 0.14 to about 0.18 and the eleventh constant is about 0.66 to about 0.70 such that the first bottom contact length 223a ($C_{bl}$) is greater than or equal to about 0.14 to about 0.18 times at least one of the first gate height 222a or the second gate height 222b (H) plus about 0.66 to about 0.70 times at least one of first gate length 203a or the second gate length 203b (L). In some embodiments, such as where at least one of the first gate height 222a or the second gate height 222b (H) is about 75 μm and at least one of the first gate length 203a or the second gate length 203b (L) is about 25 μm, the first bottom contact length 223a ($C_{bl}$) is greater than or equal to about 27 μm to about 31 μm.

In some embodiments, the dimensions of the semiconductor arrangement 200, such as a first average length comprising an average of the first bottom contact length 223a and the first top contact length 227a, conform to equation (6) below.

$$C_{al} \geq (k12 \times H) + (k13 \times L) \qquad (6)$$

In equation (6), $C_{al}$ is an average contact length of a contact, such as an average of the first bottom contact length 223a of the first contact 215a and the first top contact length 227a of the first contact 215a, k12 is a twelfth constant, H is the height of a gate adjacent the contact in question, such as at least one of the first gate height 222a or the second gate height 222b, k13 is a thirteenth constant and L is the length of the gate adjacent the contact in question, such as at least one of the first gate length 203a or the second gate length 203b. In some embodiments, the twelfth constant is approximately 0.20 and the thirteenth constant is approximately 0.70. In some embodiments, the twelfth constant is about 0.18 to about 0.22 and the thirteenth constant is about 0.68 to about 0.72 such that the first average contact length ($C_{al}$) is greater than or equal to about 0.18 to about 0.22 times at least one of the first gate height 222a or the second gate height 222b (H) plus about 0.68 to about 0.72 times at least one of the first gate length 203a or the second gate length 203b (L). In some embodiments, such as where at least one of the first gate height 222a or the second gate height 222b (H) is about 75 μm and at least one of the first gate length 203a or the second gate length 203b (L) is about 25 μm, the average contact length ($C_{al}$) is greater than or equal to about 30.5 μm to about 34.5 μm.

In some embodiments, a contact, such as the first contact 215a, in a semiconductor arrangement having dimensions that conform to equations (1-6), has lower resistance with little to no increased capacitance, which reduces power consumption of the semiconductor arrangement as compared to a semiconductor arrangement that does not have dimensions that conform to equations (1-6).

With reference to FIG. 2, the first active region 207 comprises epitaxial (Epi) caps 206a and 206b, the first gate 208a, the second gate 208b, and the first contact 215a between the first gate 208a and the second gate 208b. In some embodiments, the first active region 207 comprises a third gate 208c adjacent the second gate 208b, where a second contact 215b1 and a third contact 215b2 are between the second gate 208b and the third gate 208c.

In some embodiments, the second active region 205 comprises the Epi caps 206a and 206b, the first gate 208a, the second gate 208b, the third gate 208c, and a fourth contact 216a between the first gate 208a and the second gate 208b. In some embodiments, the second active region 205 comprises the third gate 208c adjacent the second gate 208b, where a fifth contact 216b1 and a sixth contact 216b2 are between the second gate 208b and the third gate 208c.

In some embodiments, an STI region 209 is between the first active region 207 and the second active region 205, where the STI region 209 comprises STI 212, the first gate 208a, the second gate 208b, and the third gate 208c. In some embodiments, the first gate 208a has the first gate length 203a, the second gate 208b has the second gate length 203b and the third gate 208c has a third gate length 203c. In some embodiments, the first contact 215a has the first top contact length 227a, the second contact 215b1 has a second top contact length 227b1 and the third contact 215b2 has a third top contact length 227b2.

In some embodiments, the second contact 215b1 and the third contact 215b2 are coplanar, such that the second contact 215b1 and the third contact 215b2 lie along a first contact plane 232a. In some embodiments, the fifth contact 216b1 and the sixth contact 216b2 are coplanar, such that the fifth contact 216b1 and the sixth contact 216b2 lie along a second contact plane 232b. In some embodiments, the first gate 208a is the first pitch distance 230a from the second gate 208b. In some embodiments, the second gate 208b is a second pitch distance 230b from the third gate 208c, where the second pitch distance 230b is measured from a location of the second gate 208b to a corresponding location of the third gate 208c, such as from the middle of the second gate 208b to a middle of the third gate 208c. In some embodiments, the fourth contact 216a has a fourth top contact length 228a, the fifth contact 216b1 has a fifth top contact length 228b1 and the sixth contact 216b2 has a sixth top contact length 228b2.

At 102 of method 100, as illustrated in FIG. 3, the first gate 208a having the first gate height 222a and the first gate length 203a is formed adjacent the second gate 208b having the second gate height 222b and the second gate length 203b, where the first gate 208a is the first pitch distance 230a from the second gate 208b, according to some embodiments. In some embodiments, the third gate 208c having a third gate height 222c and a third gate length 203c is formed adjacent the second gate 208b, where the second gate 208b is the second pitch distance 230b from the third gate 208c. In some embodiments, at least one of the first gate 208a, the second gate 208b or the third gate 208c is formed with dimensions so as to conform to equation (2). In some embodiments, at least one of the dimensions of the first gate 208a are equal to the dimensions of the second gate 208b, the dimensions of the second gate 208b are equal to the dimensions the third gate 208c or the dimensions of the first gate 208a are equal to the dimensions of the third gate 208c.

In some embodiments, at least one of the first gate 208a, the second gate 208b, or the third gate 208c are formed over the Epi caps 206a and 206b. In some embodiments, the Epi caps 206a and 206b are formed over one or more fins 204, as illustrated in FIG. 5. In some embodiments, the Epi caps 206a and 206b are grown. In some embodiments, the Epi caps 206a and 206b comprises at least one of silicon or germanium. In some embodiments, the one or more fins 204 comprise the same material as a substrate 202. In some embodiments, the substrate 202 comprises an epitaxial layer, a silicon-on-insulator (SOI) structure, a wafer, or a die formed from a wafer, according to some embodiments. In some embodiments, the substrate 202 comprises at least one of silicon or germanium. In some embodiments, the one or more fins 204 are formed in the substrate 202 of the first active region 207. In some embodiments, the second active region 205 is formed substantially the same way as the first active region 207. In some embodiments, as illustrated in FIGS. 3 and 4, a first gate dielectric 234a is formed prior to the formation of the first gate 208a, such that the first gate 208a is over the first gate dielectric 234a. In some embodiments, a second gate dielectric 234b is formed prior to the formation of the second gate 208b, such that the second gate 208b is over the second gate dielectric 234b. In some embodiments, a third gate dielectric 234c is formed prior to the formation of the third gate 208c, such that the third gate 208c is over the third gate dielectric 234c.

At 104 of method 100, as illustrated in FIG. 4, the first contact 215a formed between the first gate 208a and the second gate 208b, where the first contact 215a has the first contact width 211a, as illustrated in FIG. 2, the first bottom contact length 223a and the first top contact length 227a, where the first contact dimensions are relative to the first gate dimensions of at least one of the first gate 208a or the second gate 208b, according to some embodiments. In some embodiments, the first contact dimensions of the first contact conform to equations (1-6). In some embodiments, as illustrated in FIGS. 2 and 5, the second contact 215b1 and the third contact 215b2 are formed between the second gate 208b and the third gate 208c, where the second contact 215b1 has a second contact width 211b1 and the third contact 215b2 has a third contact width 211b2.

In some embodiments, as illustrated in FIG. 4, the second contact 215b1 has a second bottom contact length 223b and the second top contact length 227b1. In some embodiments, the second contact dimensions of the second contact 215b1 comprise the second bottom contact length 223b, the second top contact length 227b1, a second critical contact distance 219b, and the second contact width 211b1. In some embodiments, the third contact 215b2 has a third bottom contact length (not shown) and a third top contact length 227b2, illustrated in FIGS. 2 and 5. In some embodiments, the third contact dimensions of the third contact 215b2 comprise the third bottom contact length (not shown), the third top contact length 227b2, a third critical contact distance (not shown), and the third contact width 211b2.

In some embodiments, a second top contact length plane 214b is the second critical contact distance 219b from a bottom surface 215b1a of the second contact 215b1. In some embodiments, the second top contact length plane 214b is parallel to the bottom surface 215b1a of the second contact 215b1. In some embodiments, the second critical contact distance 219b is about 1.58 to about 1.62 times at least one of the second gate length 203b or the third gate length 203c, and thus conforms to equation (1). Turning to FIG. 2, at least one of the second contact 215b1 or the third contact 215b2 are formed to conform to equation (3) such that a sum of the second contact width 211b1 and the third contact width 211b2 is about 1.48 to about 1.52 times greater than or equal to at least one of the second gate length 203b or the third gate length 203c, according to some embodiments.

In some embodiments, such as illustrated in FIG. 4, at least one of the second contact 215b1 or the third contact 215b2 are formed to conform to equation (4) such that the top contact length average ($C_{tl}$) of the second top contact length 227b1 and the third top contact length 227b2, illustrated in FIGS. 2 and 5, is greater than or equal to about 0.18 to about 0.22 times at least one of the second gate height 222b or the third gate height 222c, illustrated in FIG. 4, plus about 0.74 to about 0.78 times at least one of the second gate length 203b or the third gate length 203c.

In some embodiments, at least one of the second contact 215b1 or the third contact 215b2, illustrated in FIGS. 2 and 5, are formed to conform to equation (5) such that the bottom contact length average ($C_{bl}$) of the second bottom contact length 223b, illustrated in FIG. 4, and the third bottom contact length (not shown) is greater than or equal to about 0.14 to about 0.18 times at least one of the second gate height 222b or the third gate height 222c plus about 0.66 to about 0.70 times at least one of second gate length 203b or the third gate length 203c.

In some embodiments, at least one of the second contact 215b1 or the third contact 215b2, illustrated in FIGS. 2 and 5, are formed to conform to equation (6) such that the second average length ($C_{al}$) comprising an average of the second bottom contact length 223b, illustrated in FIG. 4, the third bottom contact length (not shown), the second top contact length 227b1 and the third top contact length 227b2, illustrated in FIGS. 2 and 5, is greater than or equal to about 0.18 to about 0.22 times at least one of the second gate height 222a or the third gate height 222b plus about 0.68 to about 0.72 times at least one of the second gate length 203b or the third gate length 203c.

Turning to FIG. 5, in some embodiments, the one or more fins 204 with Epi caps 206a and 206b pass through the second gate 208b, such that on a first side 256 of the second gate 208b, the Epi caps 206b comprise one of a source or a drain and on a second side 258 of the second gate 208b, the Epi caps 206a comprise a source if the Epi caps 206b comprise a drain or a drain if the Epi caps 206b comprises a source. In some embodiments, the STI region 209 comprises the STI 212, where the STI 212 is situated such that the STI 212 separates the one or more fins 204 with Epi caps 206a and 206b in the first active region 207 from the one or more fins 204 with Epi caps 206a and 206b in the second active region 205. The third gate 208c is not shown in FIG. 5 to simplify the figure.

In some embodiments, the fourth contact 216a is formed to have dimensions that conform to equation (2), where the dimensions of the fourth contact 216a comprise a fourth bottom contact length 224a, the first top contact length 228a, a fourth critical contact distance 220a, and a fourth contact width 210a. In some embodiments, the fifth contact 216b1, illustrated in FIG. 2, is formed to have dimensions that conform to equation (2), where the dimensions of the fifth contact comprise a fifth bottom contact length (not shown), the fifth top contact length 228b1, a fifth critical contact distance (not shown), and a fifth contact width 210b1. In some embodiments, the sixth contact 216b2 is formed to have dimensions that conform to equation (2), where the sixth contact dimension comprise a third bottom contact length 224b, the sixth top contact length 228b2, a sixth critical contact distance 220b, and a sixth contact width 210b2. In some embodiments, the fourth contact 216a, the fifth contact 216b1 and the sixth contact 216b2 are formed in the second active region 205 in the same manner and with the same dimensions as described above with regard to the first contact 215a, the second contact 215b1 and the third contact 215b2, as illustrated in FIGS. 2-4.

Figure 6:
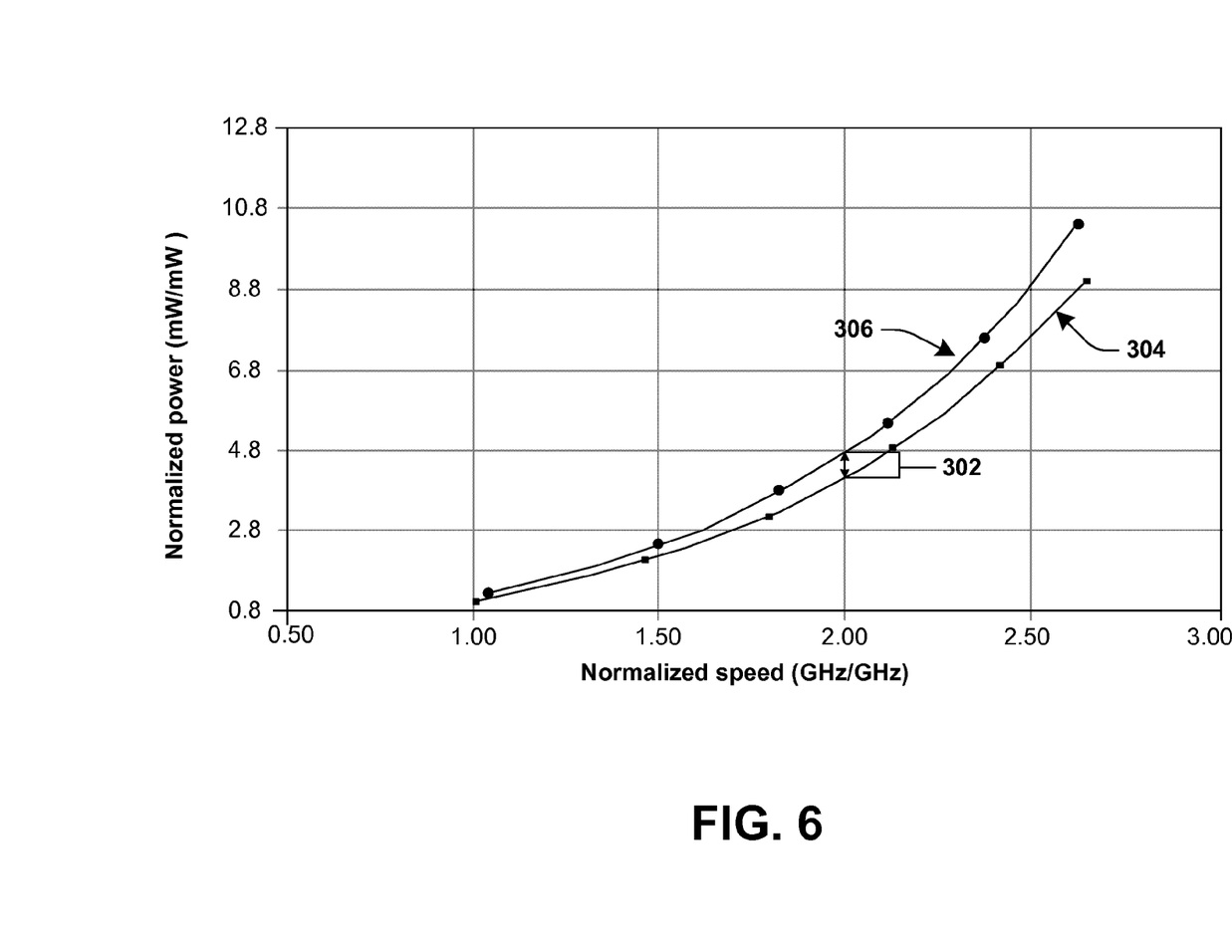
FIG. 6 is a graphic representation of values associated with semiconductor arrangements, in accordance with some embodiments.

Turning to FIG. 6, which illustrates a graphic representation of normalized power in mW/mW on a y-axis versus a normalized speed in GHz/GHz on an x-axis for semiconductor arrangements having a cell area limitation of about 1.16× web runtime (W.R.T.), according to some embodiments. In some embodiments, a curve 304 represents the normalized power versus the normalized speed of the semiconductor arrangement 200, where the semiconductor arrangement 200 has dimensions that conform to equations (1-6) above. In some embodiments, a curve 306 represents the normalized power versus the normalized speed of a semiconductor arrangement that has dimensions that do not conform to equations (1-6) above. In some embodiments, the semiconductor arrangement 200 exhibits an decrease in normalized power or power consumption as compared to the semiconductor arrangement that does not have dimensions in accordance with equations (1-6). According to some embodiments, at a normalized speed of about 2.00 GHz/GHz the semiconductor arrangement 200 has a decrease 302 in power consumption of about 15%. In some embodiments, the decrease in power consumption is attributable, at least in part, to a decreased contact resistance, such as a decrease in the resistance of the first contact 215a.

Figure 7:
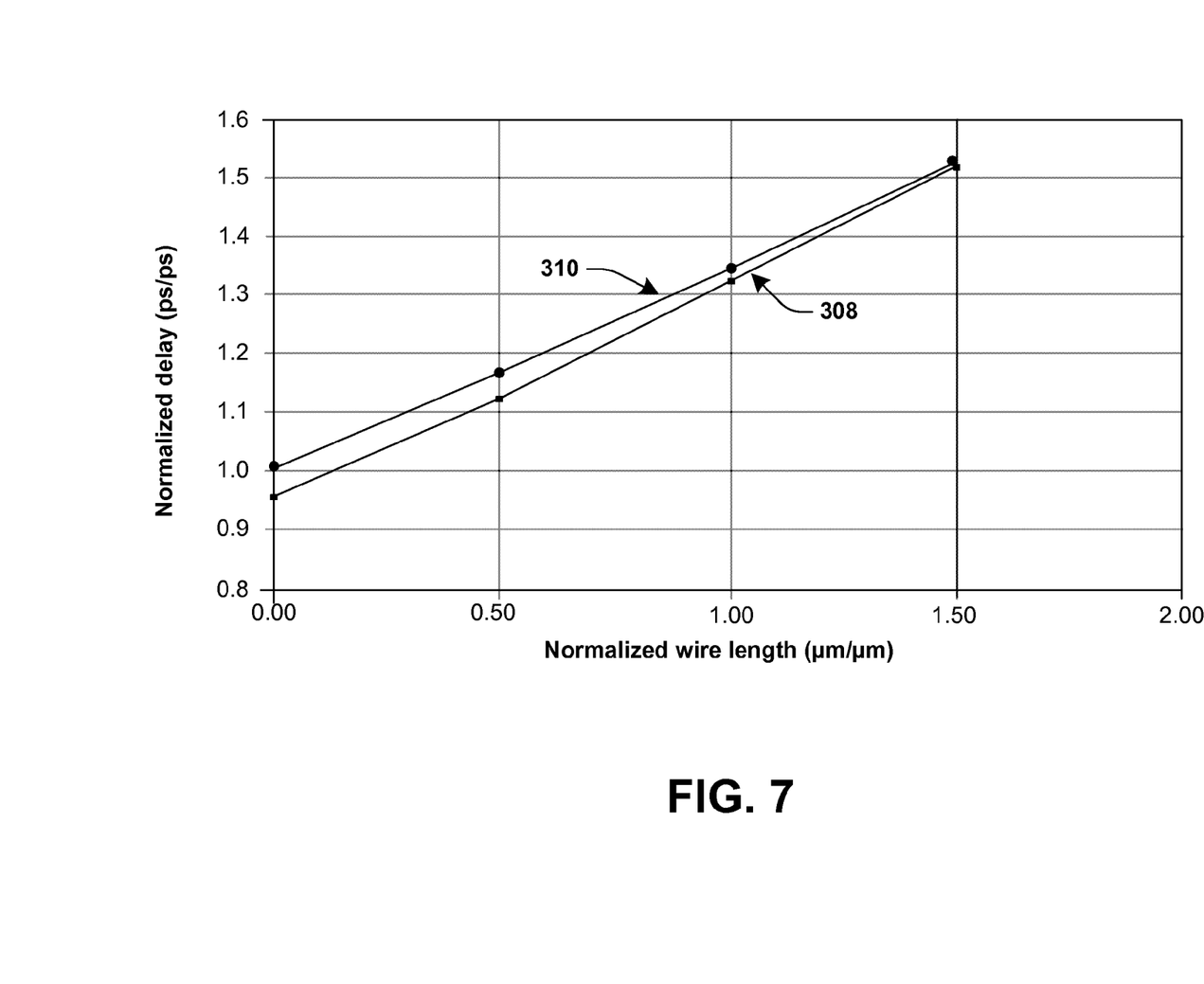
FIG. 7 is a graphic representation of values associated with semiconductor arrangements, in accordance with some embodiments.

Turning to FIG. 7, which illustrates a graphic representation of normalized delay in ps/ps on a y-axis versus a normalized wire length in um/um on an x-axis for semiconductor arrangements having a cell area limitation of about 1.16× W.R.T., according to some embodiments. In some embodiments, a line 308 represents the normalized delay versus the normalized wire length of the semiconductor arrangement 200, where the semiconductor arrangement 200 has dimensions that conform to equations (1-6) above. In some embodiments, a line 310 represents the normalized delay versus the normalized wire length of a semiconductor arrangement that has dimensions that do not conform to equations (1-6) above. In some embodiments, the semiconductor arrangement 200 exhibits a decreased delay for the same normalized wire length as compared to the semiconductor arrangement that does not have dimensions in accordance with equations (1-6)

above. In some embodiments, a wire length corresponds to a length of a contact, such as the first contact 215a. A contact, such as the first contact 215, of the semiconductor arrangement 200 of equal length to a corresponding contact of a semiconductor arrangement not in conformance with equations (1-6) thus has a decreased delay. The decrease in delay is attributable, at least in part, to a decreased contact resistance, such as a decrease in the resistance of the first contact 215a.

Figure 8:
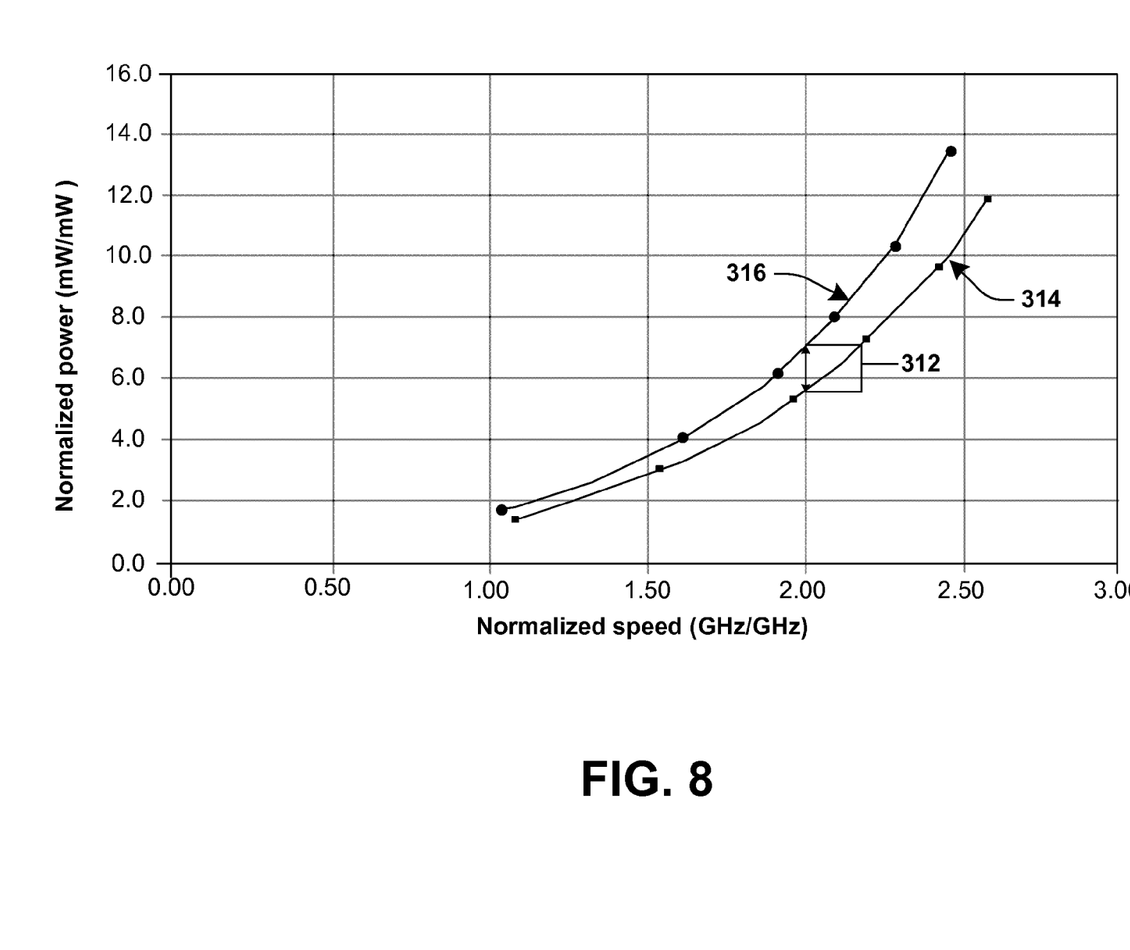
FIG. 8 is a graphic representation of values associated with semiconductor arrangements, in accordance with some embodiments.

Turning to FIG. 8, which illustrates a graphic representation of normalized power in mW/mW on a y-axis versus a normalized speed in GHz/GHz on an x-axis of semiconductor arrangements having a cell area limitation of about 1.49× W.R.T., according to some embodiments. In some embodiments, a curve 314 represents the normalized power versus the normalized speed of the semiconductor arrangement 200, where the semiconductor arrangement 200 has dimensions that conform to equations (1-6) above. In some embodiments, a curve 316 represents the normalized power versus the normalized speed of a semiconductor arrangement that has dimensions that do not conform to equations (1-6) above. In some embodiments, the semiconductor arrangement 200 exhibits an decrease in normalized power or power consumption as compared to the semiconductor arrangement that does not have dimensions in accordance with equations (1-6). According to some embodiments, at a normalized speed of about 2.00 GHz/GHz the semiconductor arrangement 200 has a decrease 312 in power consumption of about 27%. In some embodiments, the decrease in power consumption is attributable, at least in part, to a decreased contact resistance, such as a decrease in the resistance of the first contact 215a.

Figure 9:
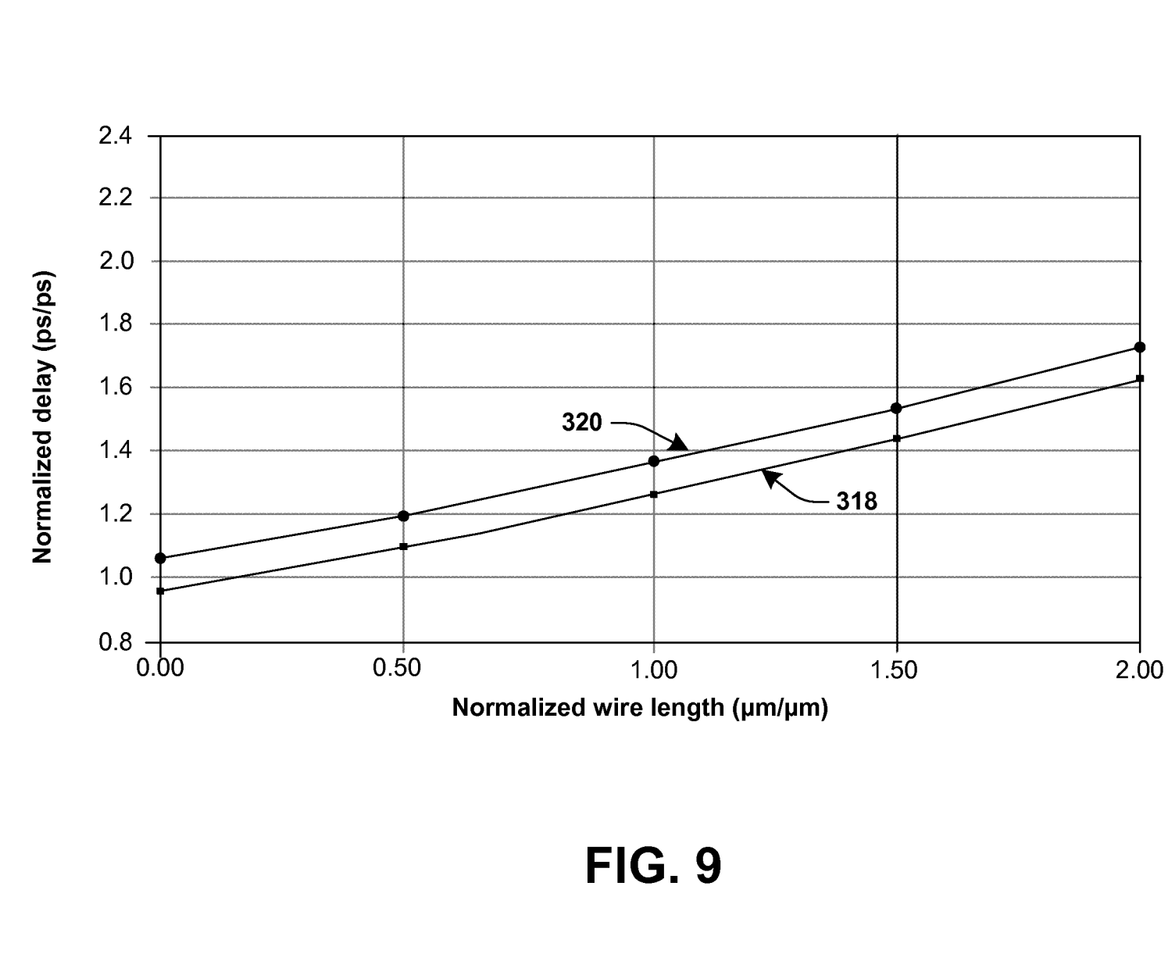
FIG. 9 is a graphic representation of values associated with semiconductor arrangements, in accordance with some embodiments.

Turning to FIG. 9, which illustrates a graphic representation of normalized delay in ps/ps on a y-axis versus a normalized wire length in um/um on an x-axis for semiconductor arrangements having a cell area limitation of about 1.49× W.R.T., according to some embodiments. In some embodiments, a line 318 represents the normalized delay versus the normalized wire length of the semiconductor arrangement 200, where the semiconductor arrangement 200 has dimensions that conform to equations (1-6) above. In some embodiments, a line 320 represents the normalized delay versus the normalized wire length of a semiconductor arrangement that has dimensions that do not conform to equations (1-6) above. In some embodiments, the semiconductor arrangement 200 exhibits a decreased delay for the same normalized wire length as compared to the semiconductor arrangement that does not have dimensions in accordance with equations (1-6) above. In some embodiments, a wire length corresponds to a length of a contact, such as the first contact 215a. A contact, such as the first contact 215, of the semiconductor arrangement 200 of equal length to a corresponding contact of a semiconductor arrangement not in conformance with equations (1-6) thus has a decreased delay. The decrease in delay is attributable, at least in part, to a decreased contact resistance, such as a decrease in the resistance of the first contact 215a.

According to some embodiments, a semiconductor arrangement comprises a first gate having a first gate height and a first gate length, the first gate adjacent a first contact having a first contact width, a first bottom contact length and a first top contact length lying within a first top contact length plane, the first top contact length plane a first critical contact distance from a bottom surface of the first contact. According to some embodiments, the arrangement comprises a second gate having a second gate height and a second gate length a first pitch distance from the first gate, the second gate adjacent the first contact, such that the first contact is between the first gate and the second gate. In some embodiments, dimensions of the semiconductor arrangement conform to $$\frac{((k2 \times H) + (k3 \times L) + P - k4)}{((k5 \times H) + P + (k6 \times L))} \leq \sim 0.56,$$

where k2 is a second constant of about 0.26 to about 0.30, H is at least one of the first gate height or the second gate height, k3 is a third constant of about 0.70 to about 0.74, L is at least one of the first gate length or the second gate length, P is the first pitch distance, k4 is a fourth constant of about 48 to about 52, k5 is a fifth constant of about 0.18 to about 0.22 and k6 is a sixth constant of about 0.78 to about 0.82.

According to some embodiments, a method of forming a semiconductor arrangement comprises forming a first gate having a first gate height and a first gate length adjacent a second gate having a second gate height and a second gate length a first pitch distance from the first gate. According to some embodiments, the method of forming a semiconductor arrangement comprises forming a first contact between the first gate and the second gate, the first contact having a first contact width, a first bottom contact length and a first top contact length. In some embodiments, dimensions of the semiconductor arrangement is formed to conform to $$\frac{((k2 \times H) + (k3 \times L) + P - k4)}{((k5 \times H) + P + (k6 \times L))} \leq \sim 0.56,$$

where k2 is a second constant of about 0.26 to about 0.30, H is at least one of the first gate height or the second gate height, k3 is a third constant of about 0.70 to about 0.74, L is at least one of the first gate length or the second gate length, P is the first pitch distance, k4 is a fourth constant of about 48 to about 52, k5 is a fifth constant of about 0.18 to about 0.22 and k6 is a sixth constant of about 0.78 to about 0.82.

According to some embodiments, a semiconductor arrangement comprises a first gate having a first gate height and a first gate length, the first gate adjacent a first contact having a first contact width, a first bottom contact length and a first top contact length lying within a first top contact length plane. In some embodiments, the semiconductor arrangement comprises a second gate having a second gate height and a second gate length a first pitch distance from the first gate, the second gate adjacent the first contact, such that the first contact is between the first gate and the second gate. In some embodiments, dimensions of the semiconductor arrangement conform to $$\frac{((k2 \times H) + (k3 \times L) + P - k4)}{((k5 \times H) + P + (k6 \times L))} \leq \sim 0.56,$$

where k2 is a second constant of about 0.26 to about 0.30, H is at least one of the first gate height or the second gate height, k3 is a third constant of about 0.70 to about 0.74, L is at least one of the first gate length or the second gate length, P is the first pitch distance, k4 is a fourth constant of about 48 to about 52, k5 is a fifth constant of about 0.18 to about 0.22 and k6 is a sixth constant of about 0.78 to about 0.82. In some embodiments, dimensions of the semiconductor arrangement conforms to W≥k7×L where W is a sum of contact widths of contacts between the first gate and the second gate, k7 is a seventh constant of about 1.48 to about 1.52, L is at least one of the first gate length or the second gate length.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement comprising:
    a first gate having a first gate height and a first gate length, the first gate adjacent a first contact having a first contact width, a first bottom contact length and a first top contact length lying within a first top contact length plane, the first top contact length plane a first critical contact distance from a bottom surface of the first contact; and
    a second gate having a second gate height and a second gate length a first pitch distance from the first gate, the second gate adjacent the first contact, such that the first contact is between the first gate and the second gate, where dimensions of the semiconductor arrangement conform to $$\frac{((k2 \times H) + (k3 \times L) + P - k4)}{((k5 \times H) + P + (k6 \times L))} \leq \sim 0.56,$$

where
    k2 is a second constant of about 0.26 to about 0.30,
    H is at least one of the first gate height or the second gate height,
    k3 is a third constant of about 0.70 to about 0.74,
    L is at least one of the first gate length or the second gate length,
    P is the first pitch distance,
    k4 is a fourth constant of about 48 to about 52,
    k5 is a fifth constant of about 0.18 to about 0.22, and
    k6 is a sixth constant of about 0.78 to about 0.82.

2. The semiconductor arrangement of claim 1, where the dimensions of the semiconductor arrangement conform to $W \geq k7 \times L$, where
    W is a sum of contact widths of contacts between the first gate and the second gate,
    k7 is a seventh constant of about 1.48 to about 1.52, and
    L is at least one of the first gate length or the second gate length.

3. The semiconductor arrangement of claim 1, where the dimensions of the semiconductor arrangement conform to $C_{tl} \geq (k8 \times H) + (k9 \times L)$, where
    $C_{tl}$ is the first top contact length,
    k8 is an eighth constant of about 0.18 to about 0.22,
    H is at least one of the first gate height or the second gate height,
    k9 is a ninth constant of about 0.74 to about 0.78, and
    L is at least one of the first gate length or the second gate length.

4. The semiconductor arrangement of claim 1, where the dimensions of the semiconductor arrangement conform to $C_{bl} \geq (k10 \times H) + (k11 \times L)$, where
    $C_{bl}$ is the first bottom contact length,
    k10 is a tenth constant of about 0.14 to about 0.18,
    H is at least one of the first gate height or the second gate height,
    k11 is an eleventh constant of about 0.66 to about 0.70, and L is at least one of first gate length or the second gate length.

5. The semiconductor arrangement of claim 1, where the dimensions of the semiconductor arrangement conform to $C_{al} \geq (k12 \times H)+(k13 \times L)$, where
- $C_{al}$ is a first average length comprising an average of the first bottom contact length and the first top contact length,
- k12 is a twelfth constant of about 0.18 to about 0.22,
- H is at least one of the first gate height or the second gate height,
- k13 is a thirteenth constant of about 0.68 to about 0.72, and
- L is at least one of the first gate length or the second gate length.

6. The semiconductor arrangement of claim 1, comprising:
- a second contact between the second gate and a third gate having a third gate height and a third gate length, the second contact having a second contact width, a second bottom contact length and a second top contact length lying within a second top contact length plane, the second top contact length plane a second critical contact distance from a bottom surface of the second contact; and
- a third contact between the second gate and the third gate, the third contact having a third contact width, a third bottom contact length and a third top contact length lying within a third top contact length plane, the third top contact length plane a third critical contact distance from a bottom surface of the third contact.

7. The semiconductor arrangement of claim 6, where the dimensions of the semiconductor arrangement conform to $D_c = k1 \times L$, where
- $D_c$ is at least one of the first critical contact distance, the second critical contact distance or the third critical contact distance,
- k1 is a first constant of about 1.58 to about 1.62, and
- L is at least one of the first gate length, the second gate length or the third gate length.

8. The semiconductor arrangement of claim 6, where the dimensions of the semiconductor arrangement conform to $C_{tl} \geq (k8 \times H)+(k9 \times L)$, where
- $C_{tl}$ is a top contact length average of the second top contact length and the third top contact length,
- k8 is an eighth constant of about 0.18 to about 0.22,
- H is at least one of the second gate height or the third gate height,
- k9 is a ninth constant of about 0.74 to about 0.78, and
- L is at least one of the second gate length or the third gate length.

9. The semiconductor arrangement of claim 6, where the dimensions of the semiconductor arrangement conform to $C_{bl} \geq (k10 \times H)+(k11 \times L)$, where
- $C_{bl}$ is a bottom contact length average of the second bottom contact length and the third bottom contact length,
- k10 is a tenth constant of about 0.14 to about 0.18,
- H is at least one of the second gate height or the third gate height,
- K11 is an eleventh constant of about 0.66 to about 0.70, and
- L is at least one of second gate length or the third gate length.

10. The semiconductor arrangement of claim 6, where the dimensions of the semiconductor arrangement conform to $C_{al} \geq (k12 \times H)+(k13 \times L)$, where
- $C_{al}$ is a second average length comprising an average of the second bottom contact length, the third bottom contact length, the second top contact length and the third top contact length,
- k12 is a twelfth constant of about 0.18 to about 0.22,
- H is at least one of the second gate height or the third gate height,
- k13 is a thirteenth constant of about 0.68 to about 0.72, and
- L is at least one of the second gate length or the third gate length.

11. A semiconductor arrangement comprising:
- a first gate having a first gate height and a first gate length, the first gate adjacent a first contact having a first contact width, a first bottom contact length and a first top contact length lying within a first top contact length plane; and
- a second gate having a second gate height and a second gate length a first pitch distance from the first gate, the second gate adjacent the first contact, such that the first contact is between the first gate and the second gate, where dimensions of the semiconductor arrangement conform to $$\frac{((k2 \times H) + (k3 \times L) + P - k4)}{((k5 \times H) + P + (k6 \times L))} \leq \sim 0.56$$

and $W \geq k7 \times L$, where
- k2 is a second constant of about 0.26 to about 0.30,
- H is at least one of the first gate height or the second gate height,
- k3 is a third constant of about 0.70 to about 0.74,
- L is at least one of the first gate length or the second gate length,
- P is the first pitch distance,
- k4 is a fourth constant of about 48 to about 52,
- k5 is a fifth constant of about 0.18 to about 0.22,
- k6 is a sixth constant of about 0.78 to about 0.82,
- W is a sum of contact widths of contacts between the first gate and the second gate, and
- k7 is a seventh constant of about 1.48 to about 1.52.

12. The semiconductor arrangement of claim 11, where the dimensions of the semiconductor arrangement conform to $C_{tl} \geq (k8 \times H)+(k9 \times L)$, where
- $C_{tl}$ is the first top contact length,
- k8 is an eighth constant of about 0.18 to about 0.22,
- H is at least one of the first gate height or the second gate height,
- k9 is a ninth constant of about 0.74 to about 0.78, and
- L is at least one of the first gate length or the second gate length.

13. The semiconductor arrangement of claim 11, where the dimensions of the semiconductor arrangement conform to $C_{bl} \geq (k10 \times H)+(k11 \times L)$, where
- $C_{bl}$ is the first bottom contact length,
- k10 is a tenth constant of about 0.14 to about 0.18,
- H is at least one of the first gate height or the second gate height,
- K11 is an eleventh constant of about 0.66 to about 0.70, and
- L is at least one of first gate length or the second gate length.

14. The semiconductor arrangement of claim 11, where the dimensions of the semiconductor arrangement conform to $C_{al} \geq (k12 \times H)+(k13 \times L)$, where
- $C_{al}$ is a first average length comprising an average of the first bottom contact length and the first top contact length,
- k12 is a twelfth constant of about 0.18 to about 0.22,
- H is at least one of the first gate height or the second gate height,
- k13 is a thirteenth constant of about 0.68 to about 0.72, and L is at least one of the first gate length or the second gate length.

15. The semiconductor arrangement of claim 11, the first top contact length plane a first critical contact distance from a bottom surface of the first contact, where the dimensions of the semiconductor arrangement conform to $D_c = k1 \times L$, where
- $D_c$ is the first critical contact distance,
- k1 is a first constant of about 1.58 to about 1.62, and
- L is at least one of the first gate length or the second gate length.

16. A semiconductor arrangement comprising:
- a gate having a gate length and a gate height; and
- a contact adjacent the gate, where a bottom surface of the contact has a bottom contact length that is greater than or equal to $(k10 \times H) + (k11 \times L)$, where
  - k10 is a tenth constant of about 0.14 to about 0.18,
  - H is the gate height,
  - K11 is an eleventh constant of about 0.66 to about 0.70, and
  - L is the gate length.

17. The semiconductor arrangement of claim 16, the contact comprising a critical contact region extending from the bottom surface to a top contact length plane, the top contact length plane a critical contact distance from the bottom surface, the critical contact distance conforming to $(k1 \times L)$, where
- k1 is a first constant of about 1.58 to about 1.62, and
- L is the gate length.

18. The semiconductor arrangement of claim 17, wherein the contact has a top contact length at the top contact length plane, the top contact length greater than or equal to $(k8 \times H) + (k9 \times L)$, where
- k8 is an eighth constant of about 0.18 to about 0.22,
- H is the gate height, and
- k9 is a ninth constant of about 0.74 to about 0.78, and
- L is the gate length.

19. The semiconductor arrangement of claim 17, wherein an average length of the critical contact region is greater than or equal to $(k12 \times H) + (k13 \times L)$, where
- k12 is a twelfth constant of about 0.18 to about 0.22,
- H is the gate height,
- k13 is a thirteenth constant of about 0.68 to about 0.72, and
- L is the gate length.

20. The semiconductor arrangement of claim 16, comprising a fin, wherein the gate surrounds at least 3 sides of the fin.

* * * * *